United States Patent
Kashima et al.

(10) Patent No.: US 10,153,072 B2
(45) Date of Patent: Dec. 11, 2018

(54) TEXTURED SUBSTRATE FOR FORMING EPITAXIAL FILM AND METHOD FOR PRODUCING THE SAME

(71) Applicant: Tanaka Kikinzoku Kogyo K.K., Tokyo (JP)

(72) Inventors: Naoji Kashima, Nagoya (JP); Tomonori Watanabe, Nagoya (JP); Shigeo Nagaya, Nagoya (JP); Kunihiro Shima, Isehara (JP); Shuichi Kubota, Tomioka (JP); Ryosuke Suganuma, Tomioka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 417 days.

(21) Appl. No.: 14/907,893

(22) PCT Filed: Jul. 22, 2014

(86) PCT No.: PCT/JP2014/069318
§ 371 (c)(1),
(2) Date: Jan. 27, 2016

(87) PCT Pub. No.: WO2015/016098
PCT Pub. Date: Feb. 5, 2015

(65) Prior Publication Data
US 2016/0163425 A1 Jun. 9, 2016

(30) Foreign Application Priority Data

Aug. 1, 2013 (JP) .................................. 2013-160230

(51) Int. Cl.
*H01B 12/06* (2006.01)
*C30B 23/02* (2006.01)
(Continued)

(52) U.S. Cl.
CPC ............. *H01B 12/06* (2013.01); *C30B 19/12* (2013.01); *C30B 23/025* (2013.01);
(Continued)

(58) Field of Classification Search
CPC ..... C30B 19/12; C30B 23/025; C30B 25/183; C30B 25/186; C30B 29/02; C30B 29/225; H01B 12/06; H01L 39/2461
See application file for complete search history.

(56) References Cited

U.S. PATENT DOCUMENTS 6,428,635 B1   8/2002  Fritzemeier et al.
6,974,501 B1 * 12/2005  Zhang ..................... C30B 23/02
                                                              117/106
(Continued)

FOREIGN PATENT DOCUMENTS

EP    2028289 A1    2/2009
EP    2829641 A1    1/2015
(Continued)

OTHER PUBLICATIONS

Extended Search Report for 14832663.0, dated Mar. 3, 2017.
(Continued)

*Primary Examiner* — Mark Kopec
*Assistant Examiner* — Jaison P Thomas
(74) *Attorney, Agent, or Firm* — Orrick, Herrington & Sutcliffe LLP; Joseph A. Calvaruso

(57) ABSTRACT

The present invention provides a textured substrate for forming an epitaxial film, including a textured metal layer on at least one surface of the layer, the textured metal layer including a copper layer having a cube texture, the textured metal layer having, on a surface of the layer, palladium added in an amount of 10 to 300 ng/mm$^2$ per unit area, the hydrogen content of the surface of the textured metal layer being 700 to 2000 ppm. This textured substrate is produced
(Continued)

through a step of adding 10 to 300 ng/mm² per unit area of palladium by strike plating to a surface of the copper layer having a cube texture.

20 Claims, 5 Drawing Sheets

(51) Int. Cl.
    *C30B 25/18*     (2006.01)
    *C30B 29/22*     (2006.01)
    *C30B 19/12*     (2006.01)
    *C30B 29/02*     (2006.01)
    *H01L 39/24*     (2006.01)

(52) U.S. Cl.
    CPC .......... *C30B 25/183* (2013.01); *C30B 25/186* (2013.01); *C30B 29/02* (2013.01); *C30B 29/225* (2013.01); *H01L 39/2461* (2013.01)

(56) References Cited

U.S. PATENT DOCUMENTS

| 9,242,433 | B2* | 1/2016 | Kashima | B32B 15/04 |
| 2002/0197501 | A1* | 12/2002 | Robbins | C23C 14/165 |
| | | | | 428/621 |
| 2009/0053550 | A1* | 2/2009 | Kashima | B32B 15/01 |
| | | | | 428/601 |

FOREIGN PATENT DOCUMENTS

| JP | 2002-251720 A | 9/2002 |
| JP | 2006-526070 A | 11/2006 |
| JP | 2008-266686 A | 11/2008 |
| JP | 2009-046734 A | 3/2009 |

OTHER PUBLICATIONS

International Search Report PCT/JP2014/069318, dated Oct. 7, 2014.

Pulsed Current Electrodeposition of Palladium, Y. Fukumoto et al, Metal Finishing, Sep. 1984, vol. 82, No. 9, pp. 77-80.

Yasuda et al., Correlation Between Cu Orientation and Pd Deposition, Proceeding of the 71st Symposium on Semiconductors and Integrated Circuits Technology, BD1, E1, p. 111-113, The Electrochemical Society of Japan Electronic Materials Committee, Tokyo, Jul. 12-13, 2007.

Yamauchi et at., Hydrogen Storage Characteristics of Pd Nanoparticle, Department of Chemistry, Graduate School of Science, p. 3-7, vol. 2007.03, ISSN 1881-9036, Feb. 1, 2011.

* cited by examiner

Fig. 2
EXAMPLE 1
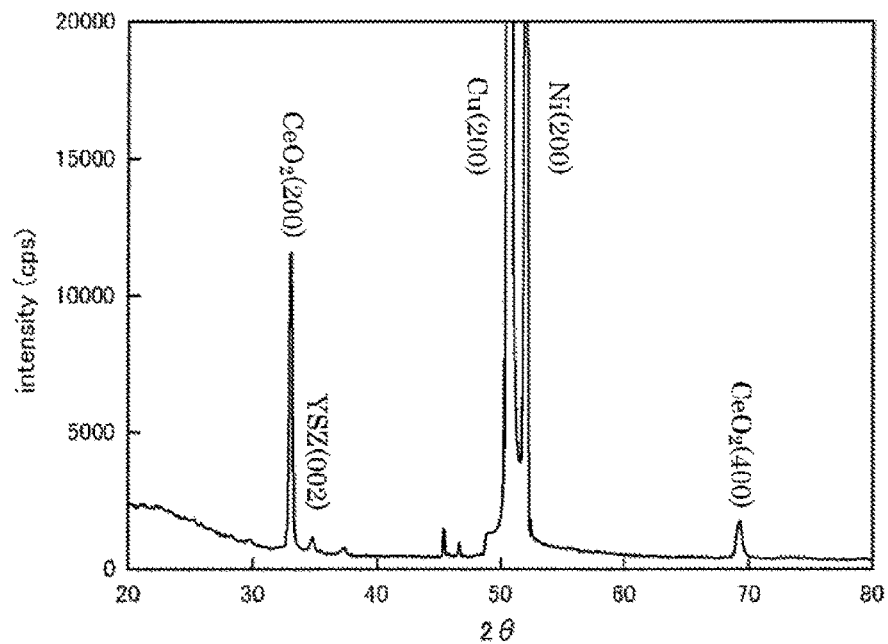
CONVENTIONAL EXAMPLE 1
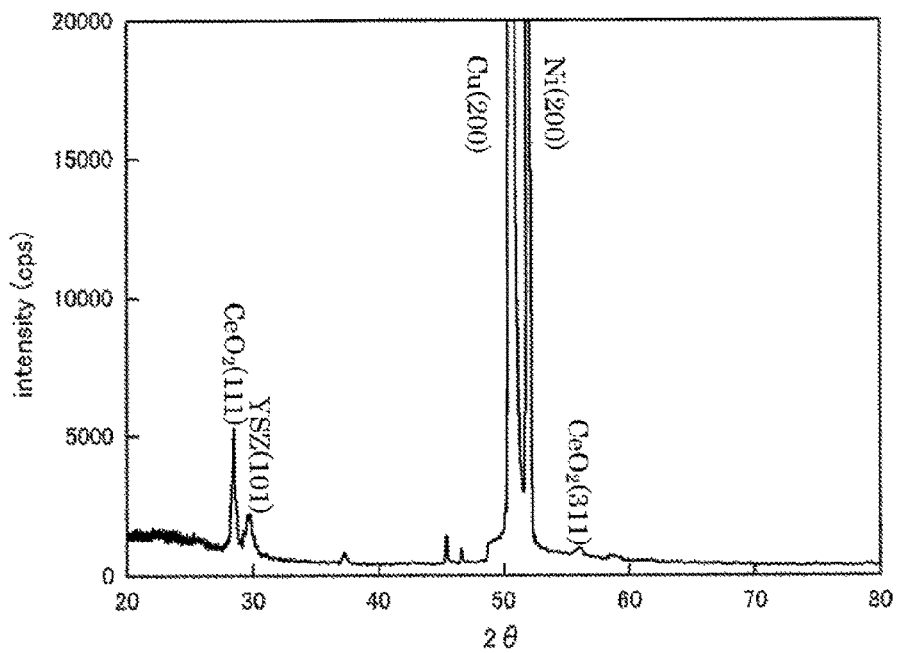

TEXTURED SUBSTRATE FOR FORMING EPITAXIAL FILM AND METHOD FOR PRODUCING THE SAME

TECHNICAL FIELD

The present invention relates to a textured substrate for growing and forming an epitaxial film of an oxide superconductive material or the like. It particularly relates to a textured substrate for forming an epitaxial film having good crystal orientation with good adhesion.

BACKGROUND ART

Materials having an epitaxial crystal structure having crystal orientation, such as oxide superconductive materials and solar cell membranes, are used in various fields focusing on their specific properties. Examples of the materials are oxide superconductive materials for forming superconductive conductors, superconductive shields, and the like to be applied to various electrical appliances. Here, materials having an epitaxial crystal structure generally have poor workability and are also sometimes disadvantageous in terms of cost in the production of bulk materials. Therefore, they are normally used as a thin film formed on a predetermined substrate.

Since a substrate for forming an epitaxial film epitaxially grows crystals having a textured structure, the surface thereof also needs to have a textured structure. As such a substrate, the present inventors found a textured substrate made basically of copper (Patent Document 1). This copper substrate for growing an epitaxial film focuses on the ease of crystal orientation control of copper, and has a {100}<001> cube texture wherein the drift angle $\Delta\phi$ of a crystal axis is as follows: $\Delta\phi \leq 6°$. In this substrate, a stainless steel or like metal layer (base material) is cladded to solve the problem of the insufficient strength of copper containing no alloying elements.

The present inventors made some modifications to the above textured substrate to improve the quality of the epitaxial film formed thereon. For example, the present inventors disclosed the above textured substrate including a copper layer, having an adequate amount of nickel thin film layer laminated on the copper surface to further improve the crystal orientation (Patent Document 2), and the like

RELATED ART DOCUMENT

Patent Documents

Patent Document 1: JP 2008-266686 A
Patent Document 2: JP 2009-046734 A

Suitability of conventional modification examples of substrates for epitaxial film formation is often judged based on quality of the crystal orientation of the substrate itself. The characteristics of an epitaxial film formed on a substrate are greatly dependent on those of the substrate, and thus this judgment standard is not necessarily incorrect. However, in reality, even when a substrate having orientation improved as much as possible is used, the crystal orientation may be disordered upon the formation of an epitaxial film, or, even when an epitaxial film can be formed, its adhesion may be insufficient. Thus, it has been difficult to set film formation conditions.

Further, as a mode of use of a material using an epitaxial film, such as a superconductive material, a material in an elongated tape shape is often used. For its production, an epitaxial film having crystal orientation is required to be uniformly formed on an elongated textured substrate. However, conventional textured substrates have the problems mentioned above, which makes it difficult to produce elongated materials.

Further, for conventional textured substrates, it is difficult to cope with recent structural changes in superconductive materials and like materials using an epitaxial film. Specifically, for example, in the formation of a superconductive material by use of a textured substrate, conventionally, rather than direct formation of a film of a superconductive material on the substrate, it is common to form an intermediate layer between the two. Such an intermediate layer was commonly formed by laminating a plurality of layers including a seed layer for mitigating the mismatch between the lattice constant of the composition metal of the substrate and the lattice constant of the superconductive material, a barrier layer for suppressing the diffusion of elements from the superconductive material to the substrate, and the like. However, in recent years, for reducing the number of steps in the production process or improving the characteristics, simplification of the intermediate layer, and particularly elimination of the seed layer, are considered, for example. Then, structural changes resulting from such intermediate layer simplification act to tighten the conditions for epitaxial film formation, which are difficult to cope with by use of a conventional textured substrate.

SUMMARY OF THE INVENTION

Problems to be Solved by the Invention

Thus, the present invention provides a textured substrate for growing an epitaxial thin film, which is capable of forming an epitaxial film having good crystal orientation and high quality with good adhesion; and also a method for producing the same.

Means for Solving the Problems

The present inventors examined causes for the problems mentioned above, that is, decreases in crystal orientation and adhesion of an epitaxial thin film. As a result, they found that there is an influence of a natural oxide film, which is formed on the substrate surface by just before the formation of an epitaxial thin film.

The presence of an oxide film on a substrate has not been completely out of consideration. The adverse influence of an oxide on a substrate caused on the subsequent film formation is generally known, and, as a measure therefor, it is recommended to perform a suitable surface treatment, such as ion beam cleaning. However, it is practically impossible to make the substrate surface completely oxygen-free from the completion of the surface treatment to the formation of an epitaxial thin film. Accordingly, at the stage of forming an epitaxial thin film, the substrate surface has an extremely thin natural oxide film formed thereon.

To suppress the formation of a natural oxide film on the substrate surface, the present inventors examined performing, instead of an external treatment such as cleaning or etching, a modification treatment to make the substrate surface resistant to film formation. As a specific technique therefor, they found the addition of a small amount of palladium on the substrate surface, and thus conceived of the present invention.

To solve the above problem, the present invention provides a textured substrate for forming an epitaxial film, including a textured metal layer on at least one surface of the layer, the textured metal layer including a copper layer having a cube texture, the textured metal layer having, on a surface of the layer, palladium added in an amount of 10 to 300 ng/mm$^2$ per unit area, the hydrogen content of the surface of the textured metal layer being 700 to 2000 ppm.

As mentioned above, in the present invention, palladium is added to a substrate surface having a textured metal layer to suppress the formation of a natural oxide film. As the reason why the formation of a natural oxide film can be suppressed by the addition of palladium like this, although this is not affirmative, the present inventors infer that the hydrogen absorbability of palladium is involved. That is, palladium is known to have higher ability to absorb/store hydrogen as compared with other metals. It is inferred that such absorbed hydrogen acts as a reducing agent, and even when a natural oxide film is formed on the substrate surface, it is immediately reduced.

Additionally, for the kind of metal added to the substrate surface, other metals than palladium, particularly metals belonging to precious metals like palladium (platinum, gold, silver, ruthenium), also are expected to act in the same manner as palladium for their antioxidative and catalytic characteristics. However, in the examination by the present inventors, as a result of the addition of these precious metals, the natural oxide film cleaning action was not seen. Also from this, it is surmised that the hydrogen absorbability of palladium is associated with the natural oxide film cleaning action.

Hereinafter, each element of the present invention will be described in further detail. As a premise, the present invention is applied to a textured substrate provided with a copper layer having a cube texture because copper is the best metal in terms of orientation control as mentioned above. The crystal orientation of this copper layer is a face-centered cubic lattice, and thus it has a {100}<001> cube texture. Additionally, needless to say, the copper layer preferably has good crystal orientation. The crystal orientation of the copper layer is preferably such that the drift angle $\Delta\phi$ of a crystal axis of the surface is 6° or less.

The textured substrate may have a monolayer structure formed only of the textured metal layer. Additionally, a reinforcing material to serve as a base material for reinforcement may also be bonded to the copper layer to serve as the textured metal layer. In this case, the base material used for the textured substrate is preferably made of stainless steel or a nickel alloy (Hastelloy alloy, Inconel alloy, Incoloy alloy, Monel alloy, or the like).
Additionally, the thickness and shape of the textured substrate are not particularly limited, and a plate shape, a foil shape, a tape shape, or the like according to the intended use can be employed. Further, copper layers may also be bonded to both sides of the base material, and a nickel layer and a nickel oxide layer may be formed thereon, respectively.

In the present invention, a predetermined amount of palladium is contained on the substrate surface (textured metal layer). The significance of the application of palladium is as mentioned above. Palladium on the substrate surface may form a completely uniform layer covering the crystal orientation improving layer, or may also be scattered over the surface of the crystal orientation improving layer. The action of palladium in the present invention is not like that of a protective film, but is a reducing action caused by absorbed hydrogen, which is similar to a catalytic action. This is because a uniform film needs not to be formed for additives having such a catalytic action.

The amount of palladium added is specified to be 10 to 300 ng/mm$^2$ per unit area of the substrate surface. The amount of palladium added is specified to as 300 ng/mm$^2$ or less per unit area in the present invention because when palladium is added in a larger amount, a thick palladium layer may be formed on the substrate surface, and although there is not the problem of a natural oxide film, this may affect the adhesion or orientation of an epitaxial film formed thereon. Additionally, the lower limit is specified to be 10 ng/mm$^2$ per unit area because when the amount is less than this, the natural oxide film cleaning action of palladium is not exerted.

Since the action of palladium described above is exerted with hydrogen being absorbed in palladium, in the textured substrate according to the present invention, it is indispensable that the surface has a high hydrogen content. Specifically, the hydrogen concentration is to be 700 to 2000 ppm. Regarding this hydrogen concentration range, a concentration of less than 700 ppm has no difference from that of conventional textured substrates, and does not have a natural oxide film removal action. Additionally, the upper limit is 2000 ppm because even when palladium has excellent hydrogen absorbability, when the amount of addition mentioned above is considered, it is difficult for the substrate surface to contain hydrogen at a concentration of more than 2000 ppm. Incidentally, such a hydrogen content is achieved in the step of adding palladium to the textured substrate, which will be described below in detail. Although palladium is preferably added to the textured substrate by plating, it is difficult to introduce a suitable amount of hydrogen by general electrolytic plating.

In the present invention, palladium is added to the textured substrate (textured metal layer) to suppress the formation of a natural oxide film, and the adhesion and uniformity of a subsequently formed epitaxial film is improved; here, it can be said that the crystal orientation of the textured substrate is preferably improved at the same time. That is, as in Patent Document 2, on the textured metal layer, a nickel layer that improves the crystal orientation of the metal layer is formed prior to the addition of palladium, so that an epitaxial thin film with higher quality than on the substrate can be formed. That is, in a more preferred aspect of the present invention, the textured substrate includes a nickel layer on the surface of the textured metal layer, and palladium is added to the surface of the nickel layer.

Nickel is applied as a crystal orientation improving layer because it has the same crystal structure (face-centered cubic lattice) as copper forming its groundwork, and also because they have similar lattice constants, which results in particularly high effectiveness in improving crystal orientation. The nickel layer preferably has a thickness of 100 to 20000 nm. This is because a thickness of more than this range results in deviation in the growth direction of a subsequently formed epitaxial film, while when the thickness is less than 100 nm, the improving effect on the degree of crystal orientation is not obtained. The nickel layer more preferably has a thickness of 500 to 10000 nm. As a result of the formation of such a nickel layer, the degree of crystal orientation of the substrate surface improves within a range of 0.1 to 3.0° relative to the degree of orientation of the copper layer surface ($\Delta\phi$).

Next, the method for producing a textured substrate for forming an epitaxial film according to the present invention will be described. A method for producing a textured substrate for forming an epitaxial film according to the present invention is for producing the textured substrate for forming an epitaxial film, including a step of adding 10 to 300 ng/mm² per unit area of palladium to a surface of a copper layer having a cube texture by strike plating.

In the above production method, the copper layer having a cube texture can be produced according to a conventional method, and a cube texture can be suitably obtained by a thermomechanical treatment.

Here, as mentioned above, the textured substrate according to the present invention is preferably provided with a nickel layer on the copper layer, to serve as the textured metal layer. When the textured substrate is provided with a nickel layer, the nickel layer is formed after the production of the copper layer. In order to maintain and improve the crystal orientation of the copper layer, the nickel layer is preferably formed by epitaxial growth. Such an epitaxial production method is not particularly limited, and any of various thin film production processes, such as PLD (Pulsed Laser Deposition), CVD (Chemical Vapor Deposition), sputtering, vacuum deposition, ion plating, ion beam deposition, spin coating, MBE (Molecular Beam Epitaxy), and plating can be employed. Plating is particularly preferable.

Palladium is added onto the textured metal layer of the textured substrate produced as above. Here, for merely adding palladium onto the substrate surface, a general thin film production process such as PLD, CVD, sputtering, vacuum deposition, ion plating, ion beam deposition, spin coating, MBE, or plating can be applied. However, in the present invention, in addition to adding palladium, at least a predetermined amount of hydrogen is also required to be retained on the substrate surface. In order for at least a predetermined amount of hydrogen to be retained on the substrate surface, hydrogen is said to be preferably absorbed in palladium at the same time as the addition of palladium. In this respect, it is difficult to intentionally mix hydrogen into the film by the general thin film production processes mentioned above.

In the present invention, as a specific method for the addition of palladium, strike plating is employed. Strike plating is a method in which a plating treatment is performed instantaneously at a high current density by use of a plating bath of prescribed composition with the hydrogen ion concentration adjusted, and generally often applied as a groundwork treatment before plating. In strike plating, a large amount of hydrogen gas can be generated from the cathode (textured substrate) during the process, and this hydrogen is absorbed in deposited palladium. Accordingly, the hydrogen content on the substrate surface after the addition of palladium can be increased.

As conditions for the addition of palladium by strike plating in the present invention, the plating bath is preferably a plating solution with a metal palladium concentration of 0.4 to 0.6 g/L and a pH of 8.5 to 9.5. Additionally, as electrolysis conditions, electrolysis is preferably performed at 35 to 45° C. and 3 to 8 A/dm². Incidentally, the amount of palladium added can be adjusted by the electrolysis conditions.

The textured substrate after the addition of palladium may be directly subjected to the formation of an epitaxial film, but may also be subjected to a suitable heat treatment. When a heat treatment is performed, the substrate surface can be smoothed at a nano-order level by the migration of a small amount of palladium added to the substrate surface. This heat treatment is preferably performed at a temperature of 400° C. or more. This is because when the temperature is lower than 400° C., the migration of the palladium atom becomes slow. The heat treatment temperature preferably has an upper limit of 1050° C., and when the temperature exceeds that temperature, the copper layer may be soften or melted. The heat treatment time is preferably 10 minutes to 2 hours. This is because when the heat treatment is less than 10 minutes, the atomic migration to smooth the surface is insufficient, while even when the heat treatment is performed for more than 2 hours, this results in no difference in effect will occur.

Additionally, the present invention is aimed at suppressing the production of a natural oxide film, and thus the heat treatment is required to be performed in a non-oxidizing atmosphere. Preferably, a reducing atmosphere having a hydrogen gas content of 5% or more is employed. For example, a mixed gas atmosphere containing hydrogen gas balanced with an inert gas (argon, and the like) can be mentioned.

Through the above steps, a textured substrate of the present invention can be produced. Incidentally, the textured substrate according to the present invention is expected to be used with a reinforcing material being bonded to the copper layer. When a textured substrate provided with such a reinforcing material is produced, the timing of the bonding of the reinforcing material is not particularly limited as long as it is after the crystal orientation treatment of the copper layer. Bonding may be performed before or after the formation of a nickel layer, or after the addition of palladium to the nickel layer and after the heat treatment.

As a method for bonding a reinforcing material to the substrate, surface-activated bonding is preferably applied. Surface-activated bonding is a method of dry etching the bonding surface of a member to be bonded, and oxides or adsorbates on the bonding surface are removed to expose its metal substrate and activate the surface, immediately followed by bonding. In this method, bonding is performed based on the metal atomic force between atoms (molecules) with the surface being completely free of impurities, such as oxides. As a specific technique for the dry etching for surface activation, argon or like ion beam etching, atom beam etching, or plasma etching can be applied. This dry etching needs to be performed in a non-oxidizing atmosphere, particularly preferably in high vacuum.

Surface-activated bonding allows for bonding with no pressure applied, and materials to be bonded can be bonded by simply stacking together. However, a pressure can also be applied for the position adjustment of the materials or for firmer bonding. Note that the pressure applied in this case should be low enough not to deform the materials, and is preferably 0.01 to 300 MPa. Additionally, surface-activated bonding allows for bonding at normal temperature. Accordingly, it is not necessary to heat the working atmosphere at the time of bonding. Incidentally, also during bonding, the atmosphere is preferably a non-oxidizing atmosphere.

The textured substrate for forming an epitaxial film according to the present invention described above is suitable for the formation of various kinds of epitaxial films thereon, and is suitable as, for example, a substrate of a superconductive material. The superconductive material includes a superconductor layer formed on the textured metal layer of the textured substrate according to the present invention, and an intermediate layer is usually formed between the substrate and the superconductor layer. This intermediate layer functions as a buffer layer considering the difference in lattice constant between the superconductive material (YBCO, and the like) and the metal forming the substrate, and also acts as a barrier layer for preventing the diffusion of metal elements contained in the substrate. The structure of the intermediate layer may be a three-layer structure including a seed layer, a barrier layer, and a cap layer or a two-layer structure with the seed layer eliminated.

Each intermediate layer is preferably made of an oxide, a carbide, or a nitride and has a thickness of 10 to 1000 nm.

Specific examples of materials forming an intermediate layer include oxides such as cerium oxide and zirconium oxide, composite oxides such as LaMnO, LaZrO, and GdZrO, and nitrides such as TiN. As oxides and composite oxides, perovskite-type and fluorite-type oxides and composite oxides are preferable. Particularly preferably, the seed layer is made of a composite oxide containing a rare earth element oxide or a rare earth element, the barrier layer is made of an oxide containing zirconium oxide, and further the cap layer is made of a composite oxide containing a rare earth element oxide or a rare earth element.

As a method for producing each oxide to serve as an intermediate layer on the substrate, PLD, CVD, sputtering, ion plating, ion beam deposition, spin coating, MBE, or MOD (Metal Organic Deposition) can be applied. This also applies to the superconductor layer. A stabilization layer is formed by a film formation method such as sputtering or deposition, or may alternatively be formed by formation of a silver layer by such a method, and then bonding of a foil-shaped copper layer thereto by use of a brazing filler metal.

Additionally, as oxide superconductive materials forming a superconductor layer, RE-based superconductive materials, particularly $RE-Ba_2Cu_3O_x$ superconductive materials, are preferable (RE is one kind or more kinds of rare earth elements). Specific examples of the material include YBCO, SmBCO, GdBCO, and $Y_{0.3}Gd_{0.7}BCO$. Additionally, the superconductor layer may be made only of such a superconductive material, or may alternatively contain an oxide different from these superconductive materials added as an artificial pin to improve the superconducting properties. Incidentally, the superconductor layer preferably has a thickness of 100 nm or more.

Advantageous Effects of the Invention

As described above, with the textured substrate for forming an epitaxial film according to the present invention, an epitaxial film having good crystal orientation with good adhesion can be formed. The conditions applied for the epitaxial film growth can also be more relaxed than conventional conditions. Besides superconductive materials, the present invention is also suitable as a substrate for producing various materials and devices that apply the characteristics of an epitaxial film, such as solar cells.

BRIEF DESCRIPTION OF THE DRAWINGS

FIG. 2 shows the results of X-ray diffraction analysis of epitaxial films formed on the textured substrates of Example 1 and the conventional example.

DESCRIPTION OF EMBODIMENTS

Hereinafter, best modes for carrying out the present invention will be described.

First Embodiment

In this embodiment, first, various kinds of precious metals were added to the surface of a textured substrate including a copper layer as a textured metal layer, and the effects of the addition of palladium were tested. For the formation of a textured metal layer, a 1000-μm-thick, tape-shaped copper plate was prepared and cold-rolled at room temperature by use of a pressure roll set to have a reduction ratio of 95%, to give a tape material of 50 μm. After rolling is performed, the copper plate was subjected to a heat treatment to orient the crystalline structure to give a {100}<001> cube texture. This heat treatment was performed by the application of heat for 2 hours at a temperature of 750° C. in an atmosphere containing 95% nitrogen gas and 5% hydrogen gas.

On the crystal-orientation-treated copper layer, a nickel layer to serve as a crystal orientation improving layer was formed by plating. For nickel plating, the substrate was subjected to acid degreasing and electrolytic degreasing, and then to electrolytic plating in a nickel plating bath (Watts's bath). The plating conditions were as follows: temperature: 40° C., current density: 1 A/dm². The plating time was adjusted to give a 1000-nm-thick nickel plating. Incidentally, when a nickel plating is formed as a crystal orientation improving layer, the conditions are preferably set within the following range: current density: 1 to 5 A/dm², bath temperature: 40 to 60° C.

For the textured substrate formed of a copper layer provided with a nickel layer, various precious metals containing palladium were added to the surface. Precious metals were each added by strike plating. This treatment was performed by use of a plating solution having a metal palladium concentration to 0.5 g/L and a pH of 9 (product name: PALLADEX STRIKE2) as a plating bath at a bath temperature of 35 to 45° C. and a current density 3 to 8 A/dm² for a plating time of 20 seconds. In this plating treatment, the amount of addition was set at 60 ng/mm² per unit area. After the addition of each precious metal, a heat treatment was performed in a non-oxidizing atmosphere (nitrogen-hydrogen mixed gas) at 700° C. for 1 hour.

Figure 1:
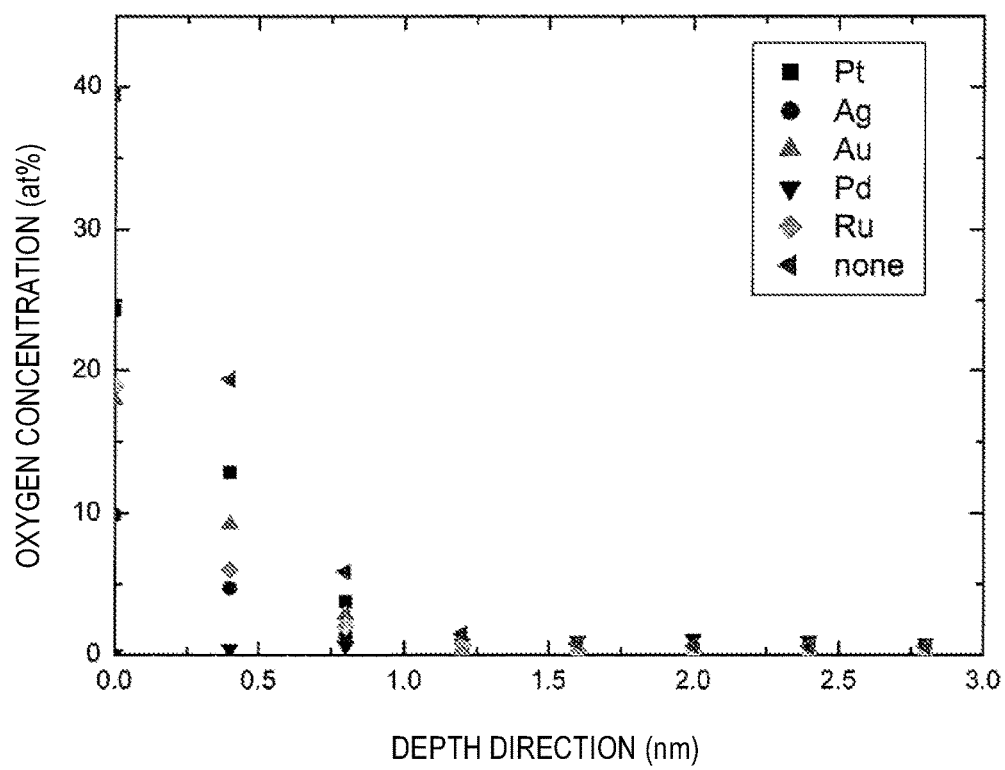
FIG. 1 shows the results of oxygen concentration XPS analysis of the surfaces of the textured substrates of the example and comparative examples.

The hydrogen content of the surface of the textured substrate produced as above was analyzed by an inert gas fusion method (analyzer: OHN836, manufactured by LECO Japan). Then, to examine whether a natural oxide film was formed, the oxygen concentration of the substrate surface 180 minutes after production was analyzed by X-ray photoelectron spectroscopy analysis (XPS). The analysis was performed on the outermost surface of the substrate and also near the surface by sputtering. The results are shown in Table 1 (hydrogen content) and FIG. 1 (oxygen concentration).

TABLE 1

|  | Added metal | Hydrogen content |
| --- | --- | --- |
| Example 1 | Pd | 783 ppm |
| Comparative Example 1 | Pt | 4.8 ppm |
| Comparative Example 2 | Ag | 3.2 ppm |
| Comparative Example 3 | Au | 3.7 ppm |
| Comparative Example 4 | Ru | 3.1 ppm |
| Conventional example | Not added | 3.3 ppm |

Referring to Table 1, the hydrogen content of the textured substrate surface is extremely high in the substrate having palladium added thereto. Referring to the results of the measurement of surface oxygen concentration (FIG. 1), the oxygen concentration of the substrate having palladium added thereto is almost zero even in the outermost surface, and no oxide is confirmed to be produced. In contrast, it is shown that in the conventional example having no metal added thereto, oxygen is present near the outermost surface and also near the surface, which indicates that an oxide was produced. Additionally, regarding the effects of other precious metals, platinum, gold, silver, and ruthenium resulted in lower oxygen concentrations than when no metal is added, which suggests that they are somewhat effective although the mechanism seems to be different from the surface hydrogen content. However, as compared with palladium, the suppressing effect on the formation of an oxide film can be said to be lower. From the above examination results, the addition of palladium was confirmed to be extremely effective to suppress the production of a natural oxide film.

Next, epitaxial films were formed by use of the textured substrates of Example 1 and the conventional example, and the orientation was evaluated. For the formation of an epitaxial film, a 100-μm-thick, tape-shaped stainless steel (SUS304) plate was bonded to the textured substrate as a reinforcing material. For the bonding of the stainless steel plate, the bonding surfaces of the copper substrate and the stainless steel plate were both surface-activated with a fast atomic beam (argon) by a surface-activated bonding device, and they were bonded together by a pressure roll. The conditions for surface-activated bonding are as follows.

Degree of vacuum: $10^{-5}$ Pa
(Inside the vacuum chamber and etching chamber: argon gas atmosphere)
Applied voltage: 2 kV
Etching time: 5 minutes
Applied pressure during bonding: 2 MPa Additionally, the substrate of the conventional example was subjected to an argon beam treatment before the formation of an epitaxial film to remove the surface oxide film much as possible (the argon beam treatment was not performed in Example 1). For the formation of an epitaxial film, a 100-nm-thick stabilized zirconia (YSZ) thin film was formed by PLD method, and further a 400-nm-thick cerium oxide ($CeO_2$) thin film was formed thereon.

After the formation of the two-layer epitaxial film, the structure and crystal orientation of the epitaxial film were evaluated. The epitaxial film surface was subjected to X-ray diffraction analysis (XRD), and the crystal orientations of YSZ and $CeO_2$ forming the epitaxial film were examined by a 2θ-θ method. Then, the crystal orientation was evaluated by a pole figure method (Shultz reflection method).

FIG. 2 shows the results of X-ray diffraction (2θ-θ method) of the epitaxial films (YSZ/$CeO_2$ continuous films) formed on the textured substrates of Example 1 and the conventional example. In the epitaxial film of Example 1, only YSZ (002) peak and $CeO_2$ (200) peak are seen, and it can be observed that each substance grows epitaxially along the crystal orientation of the layer immediately thereunder. Meanwhile, in the epitaxial film of the conventional example, there are only YSZ (101) peak and $CeO_2$ (111) peak. This indicates that the film grows along the preferred orientation of each substance independently of the orientation of the layer immediately thereunder, which indicates that the function of the textured substrate is not exerted.

Figure 3:
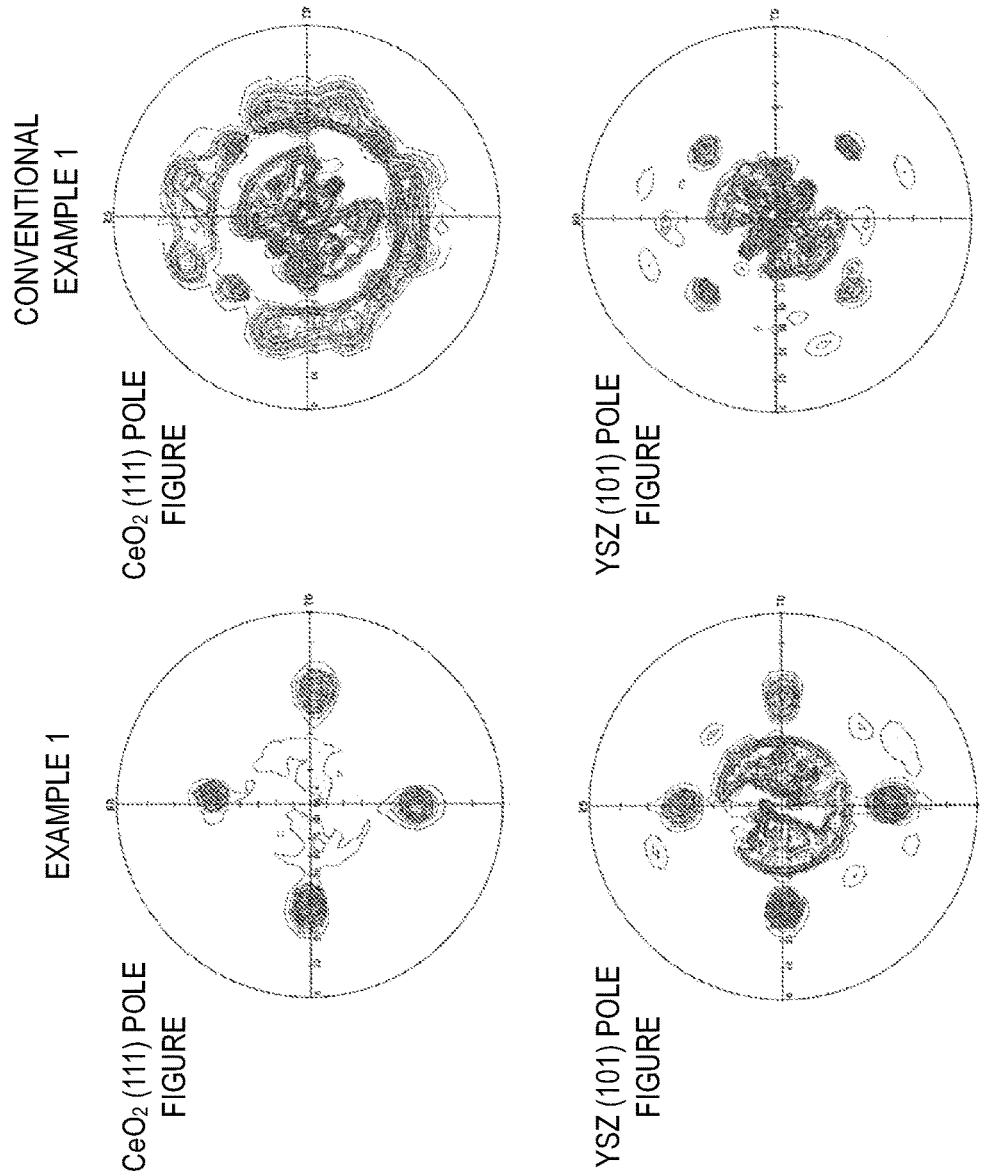
FIG. 3 shows X-ray pole figures of epitaxial films formed on the textured substrates of Example 1 and the conventional example.

This can be also understood also from the pole figures. FIG. 3 shows X-ray pole figures of the continuous epitaxial films (YSZ/$CeO_2$) formed on the textured substrates of Example 1 and the conventional example. In the epitaxial film of Example 1, YSZ and $CeO_2$ are shown to have high orientation. In contrast, in the conventional example, it can be observed that YSZ and $CeO_2$ each grow along its preferred orientation, and, as a result, the $CeO_2$ crystal orientation is significantly inferior.

Figure 4:
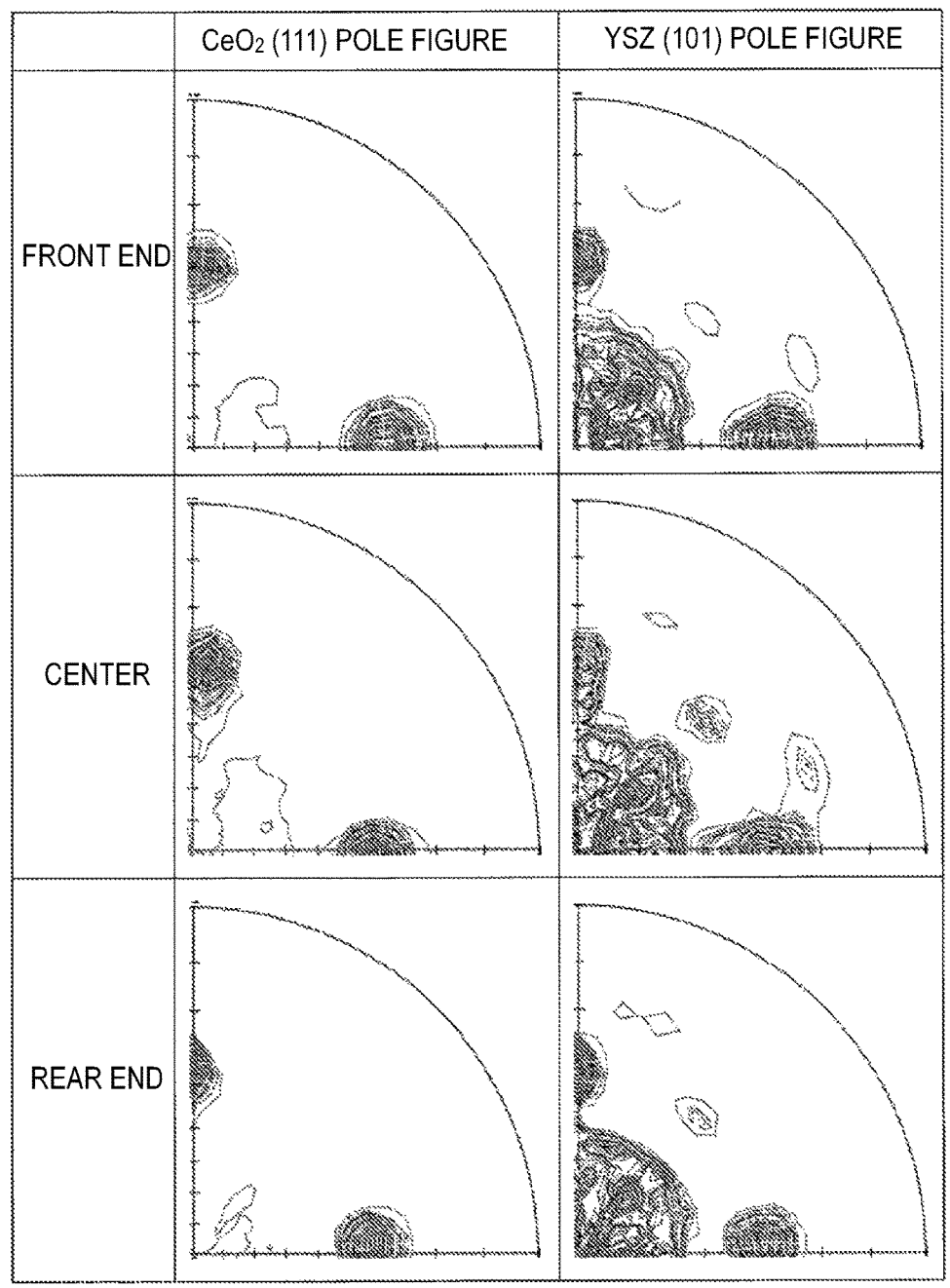
FIG. 4 shows X-ray pole figures of an epitaxial film on the textured substrate of Example 1 in the length direction (front end portion, central portion, rear end portion).

Additionally, FIG. 4 shows X-ray pole figures of the YSZ/$CeO_2$ continuous film on the textured substrate of Example 1 in the length direction, showing a front end portion, a central portion, a rear end portion. In the epitaxial film of Example 1, the same crystal orientation is seen in every point, and no variation can be observed in the length direction. Accordingly, it was confirmed that even when an elongated epitaxial film was formed, the textured substrate of Example 1 having palladium added thereto allowed for the formation of a film with stable crystal orientation.

From the above examination results, it was confirmed that when palladium was added to a textured substrate by a suitable treatment while increasing the hydrogen content, such a substrate allowed for the growth of an epitaxial film while maintaining good crystal orientation. This is attributable to the suppressive action on the production of a natural oxide film caused by palladium, and it appears that other metals have no such action. Additionally, the addition of palladium allows for formation of a good epitaxial film even without cleaning the substrate surface before the epitaxial film formation (argon beam treatment), and it can be said that this technique is also excellent in terms of efficiency.

Second Embodiment

Here, when the treatment conditions for the addition of palladium were varied and a different addition method was applied, it was examined whether there would be any difference in the hydrogen content of the textured substrate surface. Palladium was added under strike plating conditions varied from the first embodiment. Additionally, the treatment was performed by use of general electrolytic plating as a method for adding palladium to produce textured substrates (Comparative Examples 5 and 6). This electrolytic plating was performed by use of a commercially available plating solution (product name: PALLADEX ADP720) at a bath temperature 30 to 50° C. and a current density 0.5 to 1.0 A/dm$^2$ for a plating time of 1 second. Incidentally, in each case, the amount of addition of palladium was set at 60 ng/mm$^2$ per unit area.

Then, the hydrogen content and oxygen concentration of the substrate surface were measured in the same manner as in the first embodiment. The results are shown in Table 2 and FIG. 5.

TABLE 2

| | Added metal | Hydrogen content |
|---|---|---|
| Example 2 | Pd | 795 ppm |
| Example 3 | | 751 ppm |
| Example 4 | | 801 ppm |
| Comparative Example 5 | | 418 ppm |
| Comparative Example 6 | | 637 ppm |

Figure 5:
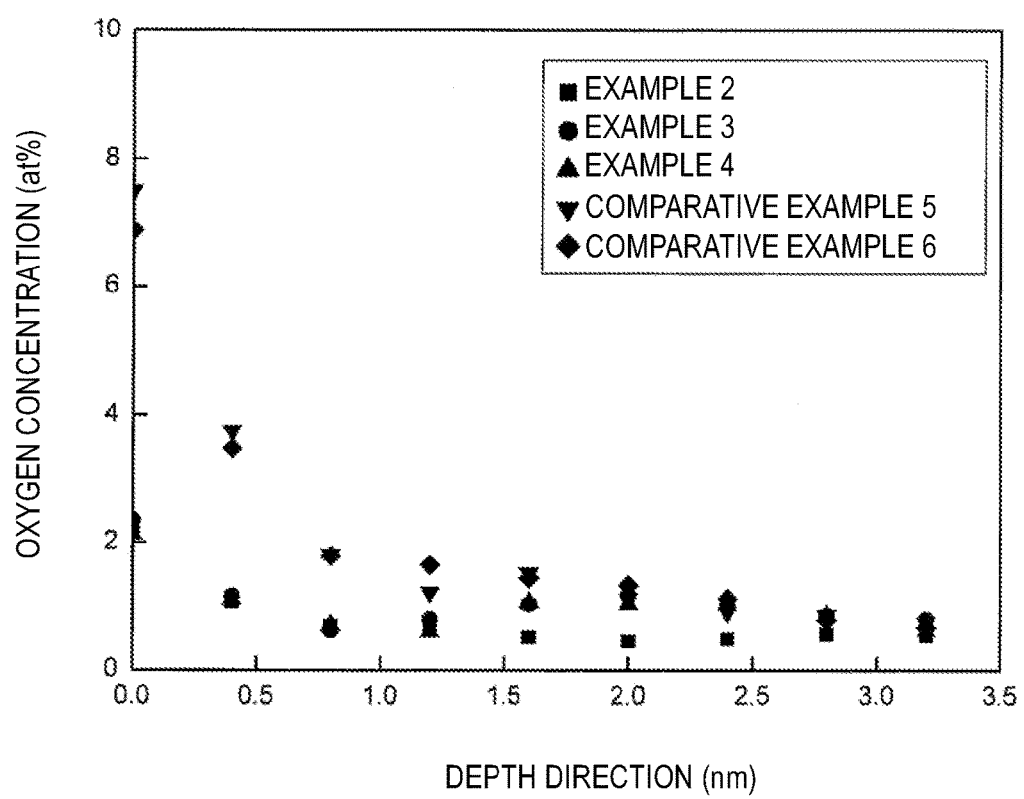
FIG. 5 shows the results of oxygen concentration analysis of the surfaces of textured substrates in the second embodiment, when the treatment conditions for the addition of palladium are varied.

From the results of Table 2 and FIG. 5, it appears that there is correlation between the hydrogen content and oxygen concentration of the substrate surface. However, in order for the effect to be exerted, certain hydrogen content is necessary. Additionally, it can be observed that even though palladium has hydrogen absorbability, it is difficult to introduce a sufficient amount of hydrogen by usual plating, and a treatment in which hydrogen can be forcibly introduced, such as strike plating, is suitable.

INDUSTRIAL APPLICABILITY

As described above, the textured substrate for forming an epitaxial film according to the present invention ensures crystal orientation and also considers the quality of an epitaxial film formed thereon. The present invention is suitable as a substrate for various materials and devices using an epitaxial film, and is useful as a substrate for forming an oxide thin film for a superconductive material, a solar cell, or the like.

The invention claimed is:

1. A textured substrate for forming an epitaxial film, comprising a textured metal layer on at least one surface of the textured substrate, wherein
the textured metal layer comprises a copper layer having a cube texture,
the textured metal layer has, on a surface of the layer, palladium added in an amount of 10 to 300 $ng/mm^2$ per unit area, and
a hydrogen content of the surface of the textured metal layer is 700 to 2000 ppm.

2. The textured substrate for forming an epitaxial film according to claim 1, wherein the textured metal layer has a nickel layer on a surface of the copper layer.

3. The textured substrate for forming an epitaxial film according to claim 2, wherein the nickel layer has a thickness of 100 to 20000 nm.

4. The textured substrate for forming an epitaxial film according to claim 3, wherein
the copper layer of the textured metal layer has a {100}<001> cube texture, and a drift angle $\Delta\phi$, of a crystal axis of the surface of the copper layer is $\Delta\phi$, 6°.

5. The textured substrate for forming an epitaxial film according to claim 3, wherein the textured metal layer includes a reinforcing material for reinforcing of the layer.

6. A superconductive material comprising at least one intermediate layer and a superconductor layer made of an oxide superconductive material formed on the textured metal layer of the textured substrate for forming an epitaxial film defined in claim 3.

7. The textured substrate for forming an epitaxial film according to claim 2, wherein
the copper layer of the textured metal layer has a {100}<001> cube texture, and a drift angle $\Delta\phi$, of a crystal axis of the surface of the copper layer is $\Delta\phi$, 6°.

8. The textured substrate for forming an epitaxial film according to claim 2, wherein the textured metal layer includes a reinforcing material for reinforcing of the layer.

9. A superconductive material comprising at least one intermediate layer and a superconductor layer made of an oxide superconductive material formed on the textured metal layer of the textured substrate for forming an epitaxial film defined in claim 2.

10. The textured substrate for forming an epitaxial film according to claim 1, wherein
the copper layer of the textured metal layer has a {100}<001> cube texture, and a drift angle $\Delta\phi$, of a crystal axis of the surface of the copper layer is $\Delta\phi$, 6°.

11. The textured substrate for forming an epitaxial film according to claim 10, wherein the textured metal layer includes a reinforcing material for reinforcing of the layer.

12. A superconductive material comprising at least one intermediate layer and a superconductor layer made of an oxide superconductive material formed on the textured metal layer of the textured substrate for forming an epitaxial film defined in claim 10.

13. The textured substrate for forming an epitaxial film according to claim 1, wherein the textured metal layer includes a reinforcing material for reinforcing of the layer.

14. A superconductive material comprising at least one intermediate layer and a superconductor layer made of an oxide superconductive material formed on the textured metal layer of the textured substrate for forming an epitaxial film defined in claim 1.

15. The superconductive material according to claim 14, wherein the intermediate layer has at least a barrier layer and a cap layer, the barrier layer is made of an oxide containing zirconium oxide, and the cap layer is made of a composite oxide containing a rare earth element oxide or a rare earth element.

16. The superconductive material according to claim 14, wherein the superconductor layer is made of a RE-based superconductive material.

17. A method for producing the textured substrate for forming an epitaxial film defined in claim 1, comprising a step of adding by strike plating 10 to 300 $ng/mm^2$ per unit area of palladium to a surface of a copper layer having a cube texture.

18. The method for producing a textured substrate for forming an epitaxial film according to claim 17, wherein conditions of the strike plating are such that plating is performed by use of a plating solution having a metal palladium concentration of 0.4 to 0.6 g/L and a pH of 8.5 to 9.5.

19. The method for producing a textured substrate for forming an epitaxial film according to claim 17, comprising a step of, before the step of adding palladium, forming a nickel layer by epitaxial growth on the surface of the copper layer having a cube texture.

20. The method for producing a textured substrate for forming an epitaxial film according to claim 17, comprising a step of, after the a step of adding palladium, heating the substrate to 400° C. or higher in a non-oxidizing atmosphere to perform a heat treatment.

* * * * *